United States Patent
Yi et al.

(10) Patent No.: US 7,772,103 B2
(45) Date of Patent: Aug. 10, 2010

(54) METHOD OF FORMING A WIRE STRUCTURE

(75) Inventors: Ho-Jun Yi, Gwangju (KR); Yong-Il Kim, Hwaseong-si (KR); Bong-Soo Kim, Seongnam-si (KR); Dae-Young Jang, Suwon-si (KR); Woo-Jeong Cho, Seoul (KR)

(73) Assignee: Samsung Electronics Co. Ltd, Suwon-si (KR)

( * ) Notice: Subject to any disclaimer, the term of this patent is extended or adjusted under 35 U.S.C. 154(b) by 219 days.

(21) Appl. No.: 12/146,729

(22) Filed: Jun. 26, 2008

(65) Prior Publication Data
US 2009/0035930 A1    Feb. 5, 2009

(30) Foreign Application Priority Data
Jun. 26, 2007    (KR) ............................... 2007-63016

(51) Int. Cl.
*H01L 21/3205* (2006.01)
*H01L 21/4763* (2006.01)

(52) U.S. Cl. ................ 438/589; 438/713; 257/E21.549; 257/E21.447; 257/E21.384

(58) Field of Classification Search ................. 438/589, 438/713; 257/E21.589, E21.383, E21.447, 257/E21.384, E21.549
See application file for complete search history.

(56) References Cited

U.S. PATENT DOCUMENTS

| 6,893,911 B2 * | 5/2005 | Beintner ..................... 438/221 |
| 7,375,016 B2 * | 5/2008 | Lee ............................. 438/589 |
| 7,648,878 B2 * | 1/2010 | Jung ........................... 438/270 |

FOREIGN PATENT DOCUMENTS

| KR | 2005-24806 | 3/2005 |
| KR | 2005-82034 | 8/2005 |
| KR | 10-530496 | 11/2005 |
| KR | 2007-2649 | 1/2007 |

* cited by examiner

*Primary Examiner*—Caridad M Everhart
(74) *Attorney, Agent, or Firm*—Stanzione & Kim LLP (57) ABSTRACT

In a method of forming a wire structure, first active regions and second active regions are formed on a substrate. Each of the first active regions has a first sidewall of a positive slope and a second sidewall opposed to the first sidewall. The second active regions are arranged along a first direction. An isolation layer is between the first active regions and the second active regions. A first mask is formed on the first active regions, the second active regions and the isolation layer. The first mask has an opening exposing the first sidewall and extending along the first direction. The first active regions, the second active regions and the isolation layer are etched using the first mask to form a groove extending along the first direction and to form a fence having a height substantially higher than a bottom face of the groove. A wire is formed to fill the groove. A contact is formed on the wire. The contact is disposed toward the second active regions from the fence.

17 Claims, 10 Drawing Sheets

METHOD OF FORMING A WIRE STRUCTURE

CROSS-REFERENCE TO RELATED APPLICATIONS

This application claims priority under 35 U.S.C. §119 to Korean Patent Application No. 2007-63016, filed on Jun. 26, 2007 in the Korean Intellectual Property Office (KIPO), the disclosure of which is incorporated by reference herein in its entirety.

BACKGROUND OF THE INVENTION

1. Field of the Invention

Example embodiments of the present general inventive concept relate to methods of forming metal wires. More particularly, example embodiments of the present general inventive concept relate to methods of forming wire structures for electrical connection of active regions.

2. Description of the Related Art

Recently, a semiconductor device is developed fast as information media such as a computer is rapidly supplied. In an aspect of function, a semiconductor device is required to have a high operation speed and a large quantity of store capacity. A technology of manufacturing a semiconductor is developed to enhance integration degrees, a reliability and a response speed in order to satisfy the above requirements.

Semiconductor devices are divided into a random access memory (RAM) device and a read only memory (ROM) device. The RAM device such as a dynamic random access memory (DRAM) device or a static random access memory (SRAM) device is a volatile device, has a rapid input/output speed and loses data as time goes on. The ROM device may maintain data when the data is stored once, but have relatively slower input/output speed. Among the ROM devices, demands for an electrically erasable and programmable ROM (EEPROM) device electrically capable of inputting or outputting data or a flash memory device has increased. The flash memory device developing from the EEPROM controls input data or output data by F-N tunneling (Fowler-Nordheim tunneling) or a hot carrier injection.

Generally, a semiconductor device is manufactured by a fabrication (FAB) process forming electric circuits on a silicon wafer serving as a semiconductor substrate, an electrical die sorting (EDS) process examining electrical characteristics of the semiconductor devices formed in the FAB process and a package process encapsulating the semiconductor devices separately by an epoxy resin.

The FAB process includes a deposition process for forming layers on a semiconductor substrate, a chemical mechanical polishing (CMP) process for planarization the layers, a photolithography process for forming a photoresist pattern on the layers, an etching process for forming the layers into a pattern having electrical characteristics, an ion implantation process for implanting ions onto a portion of the semiconductor substrate, a washing process for removing impurities on the semiconductor substrate, an examining process for detecting defects of the semiconductor substrate having the layers and the pattern, and a process of forming wires on the semiconductor substrate.

The process of forming wires is generally performed using metal or metal nitride having electrical conductivity because a semiconductor is required to have high operation speed and a large quantity of store capacity. As large storage capacity and high operation speed are required, a chip has been reduced in size, and a method of forming a word line having a thin width is required. Accordingly, a method of forming a cell word line having a buried channel array transistor (BCAT) structure has been developed. However, when the wire is formed, a fence is formed at an active region, so that a reliability of the semiconductor device may be decreased.

SUMMARY OF THE INVENTION

Example embodiments of the present general inventive concept provide a method of forming a wire structure properly applying a voltage to active regions through a contact although a fence protruding from the active regions to cut the wire structure is formed.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing a method of forming a wire structure. In a method of forming the wire structure, first active regions and second active regions are formed on a semiconductor substrate. Each of the first active regions has a first sidewall and a second sidewall opposed to the first sidewall. The second active regions are arranged along a first direction. The first sidewall has a positive slope. An isolation layer is formed on the semiconductor substrate between the first active regions and the second active regions. A first mask is formed on the first active regions, the second active regions and the isolation layer. The first mask has an opening exposing the first sidewall and extending along the first direction. The first active regions, the second active regions and the isolation layer are etched using the first mask, to form a groove extending along the first direction and to form a fence from the first sidewall. The fence has a height substantially higher than a bottom face of the groove. A wire filling the groove is formed, and then a contact is formed on the wire. The contact is disposed toward the second active regions from the fence.

In example embodiments, the positive slope of the first sidewall may be generated from an angular loading effect. To form the first and the second active regions, second masks may be formed on the substrate. Adjacent second masks may be separated from each other along the first direction. The substrate may be partially etched using the second masks as etching masks. Then, the second masks may be removed from the substrate.

In example embodiments, a first portion of the second masks disposed on the first sidewall may have a density substantially smaller than that of a second portion of the second masks disposed on the second sidewall. A sidewall of the first portion of the second masks may be separated from a sidewall of an adjacent second mask. A sidewall of the second portion of the second masks disposed on the second sidewall may be closed to the sidewall of the adjacent second mask.

In a formation of the wire according to example embodiments, a conductive layer may be formed to fill the groove. The conductive layer may be partially removed to provide the wire having a height substantially lower than a depth of the groove. The wire may have a height substantially lower than that of the fence so that the wire may be cut by the fence. The second sidewall and sidewalls of the second active regions may be substantially perpendicular to the substrate.

In example embodiments, the first and the second active regions may be simultaneously formed.

The foregoing and/or other aspects and utilities of the present general inventive concept may also be achieved by providing a method of forming a wire structure. In a method of forming the wire structure, a plurality of first active regions and a plurality of second active regions are formed on a semiconductor substrate. Each of the first active regions has a first sidewall and a second sidewall opposed to the first sidewall. The second active regions are arranged along a first direction. The first sidewall includes a first portion having a positive slope and a second portion substantially perpendicular to the semiconductor substrate. An isolation layer is formed between the first active regions and the second active regions. A first mask having an opening exposing the first sidewall and extending along the first direction is formed on the first active regions, the second active regions and the isolation layer. The first active regions, the second active regions and the isolation layer are etched using the first mask as an etching mask to form grooves extending along the first direction and to form a fence extending from the first sidewall. The fence has a height substantially higher than bottom faces of the grooves. A wire filling the groove is formed, and a contact is formed on the wire. The contact is disposed toward the second active regions from the fence.

In example embodiments, the positive slope of the first sidewall may be caused by an angular loading effect. To form the first and the second active regions, second masks may be formed on the substrate. Adjacent second masks may be separated from each other along the first direction. The substrate may be partially etched using the second masks as etching masks.

In example embodiments, a first portion of the second masks disposed on the first sidewall may have a density substantially smaller than that of a second portion of the second masks disposed on the second sidewall. A sidewall of the first portion of the second masks disposed on the first sidewall may be spaced apart from a sidewall of an adjacent second masks. A sidewall of the second portion of the second masks disposed on the second sidewall may be adjacent to a sidewall of another second mask.

According to example embodiments of the present general inventive concept, a position of a contact may be changed in accordance with a location of a fence generated on active regions. When the fence that cuts a wire is formed beneath the wire, voltages may be properly applied to the active regions through the contact. As a result, a semiconductor device may have enhanced reliability and electrical characteristics.

The foregoing and/or other aspects and utilities of the present general inventive concept may also be achieved by providing a method of forming a wire structure, including forming a plurality of active regions along a first direction on a substrate such that an active region at an end of the plurality of active regions includes a first sidewall having a positive slope and a second sidewall disposed opposite to the first sidewall and perpendicular to the substrate while the other active regions include opposing sidewalls perpendicular to the substrate; forming an isolation layer across and between the active regions; forming a mask on the active regions and the isolation layer, the first mask having an opening exposing the first sidewall of the end active region and extending along the first direction; partially etching the active regions and the isolation layer using the first mask to form a groove extending along the first direction and to form a fence from a portion of the first sidewall, the fence having a height substantially higher than a bottom surface of the groove; forming a wire within the groove; and forming a contact on the wire farthest from the fence.

BRIEF DESCRIPTION OF THE DRAWINGS

The above and other features and utilities of the present general inventive concept will become more apparent by describing in detailed example embodiments thereof with reference to the accompanying drawings, in which.

DETAILED DESCRIPTION OF THE PREFERRED EMBODIMENTS

The present general inventive concept is described more fully hereinafter with reference to the accompanying drawings, in which example embodiments of the present general inventive concept are shown. The present general inventive concept may, however, be embodied in many different forms and should not be construed as limited to the example embodiments set forth herein. Rather, these example embodiments are provided so that this disclosure will be thorough and complete, and will fully convey the scope of the general inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the general inventive concept are described herein with reference to cross-sectional illustrations that are schematic illustrations of idealized example embodiments (and intermediate structures) of the present general inventive concept. As such, variations from the shapes of the illustrations as a result, for example, of manufacturing techniques and/or tolerances, are to be expected. Thus, example embodiments of the present general inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present general inventive concept will be explained in detail with reference to the accompanying drawings.

Figure 1:
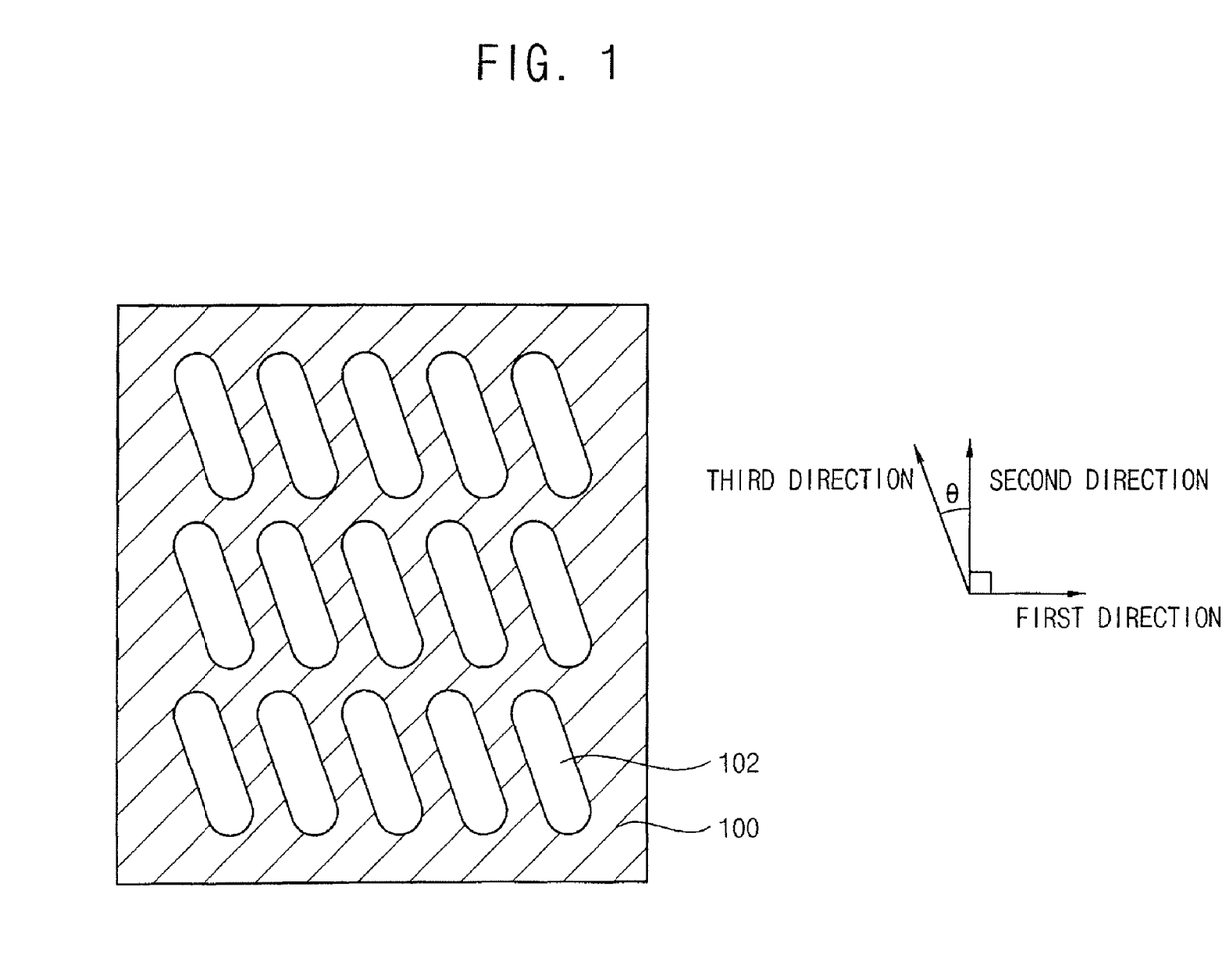
FIGS. 1, 2, 7, 10 and 13 are plan views illustrating a method of forming a wire structure in accordance with example embodiments of the present general inventive concept.
Figure 2:
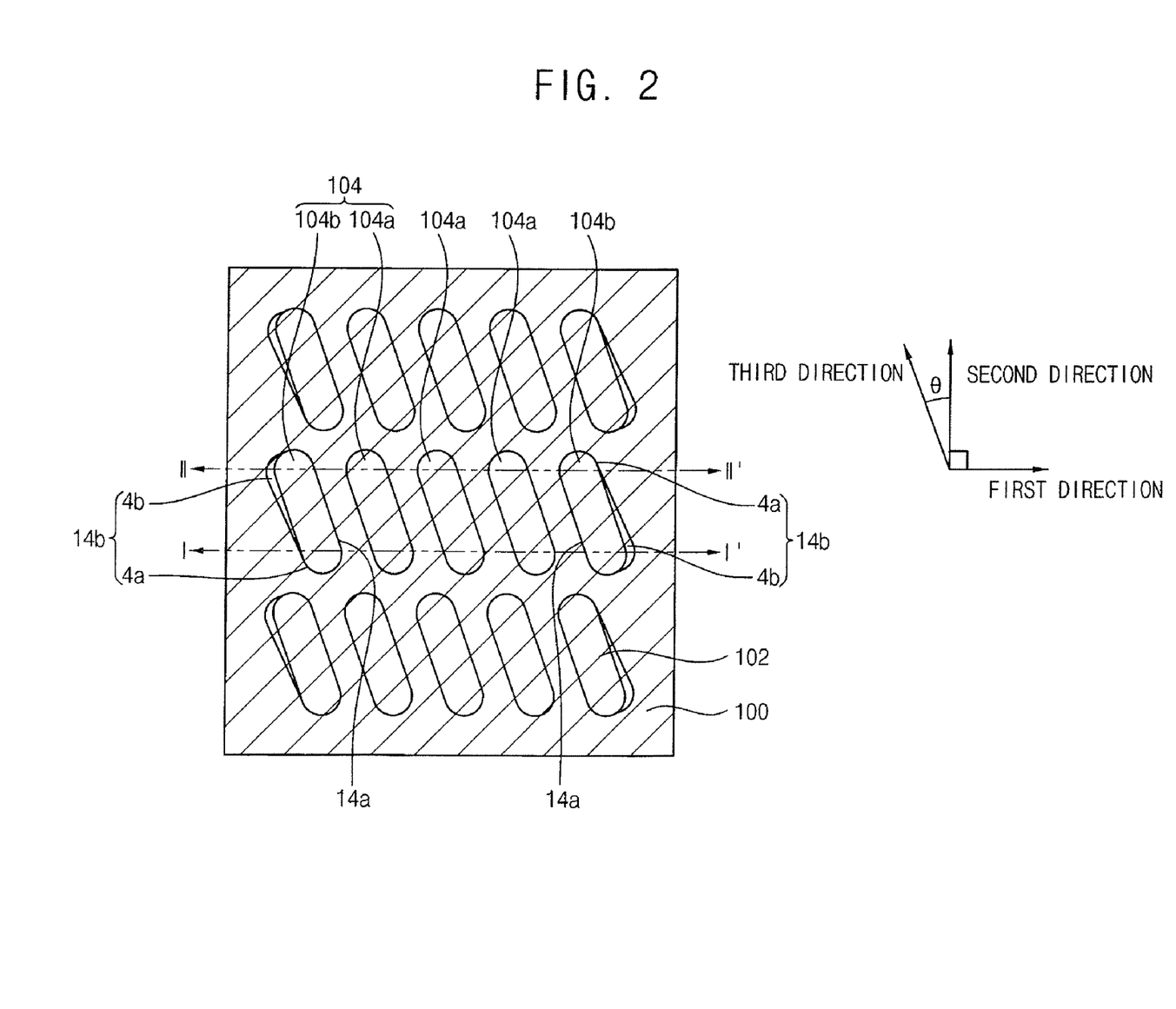
Figure 3:
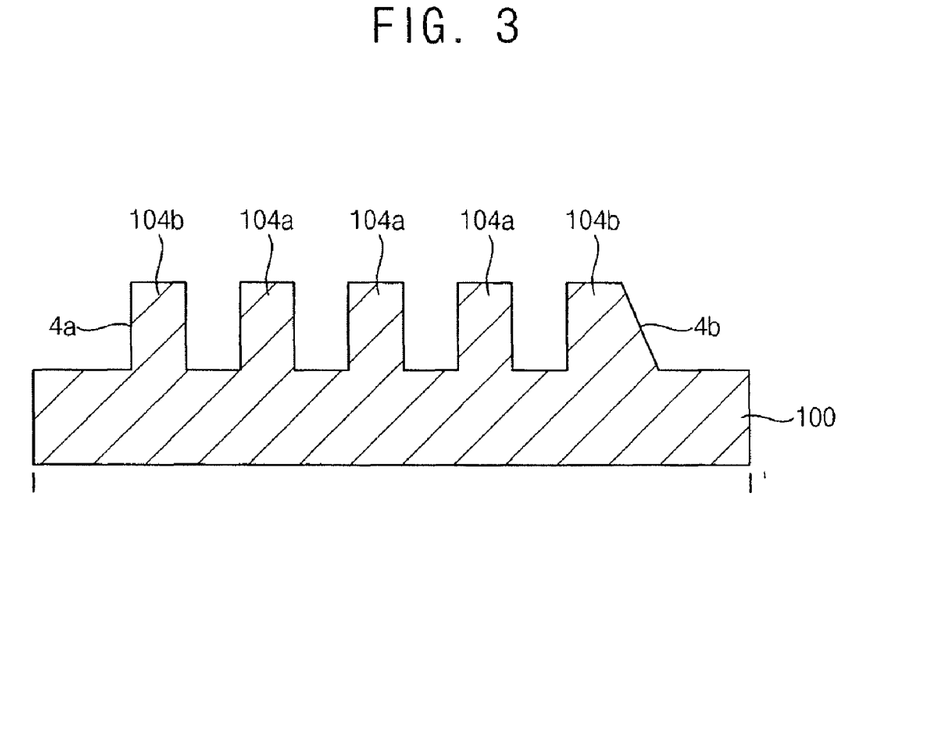
FIG. 3 is a cross-sectional view taken along a line I-I' in FIG. 2.
Figure 4:
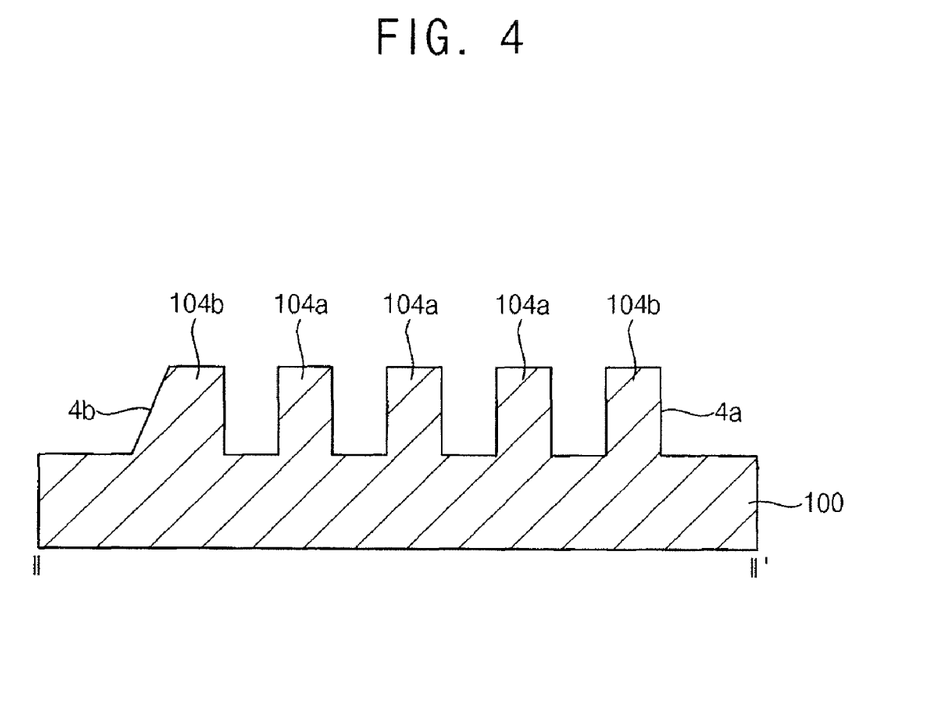
FIG. 4 is a cross-sectional view taken along a line II-II' in FIG. 2.
Figure 7:
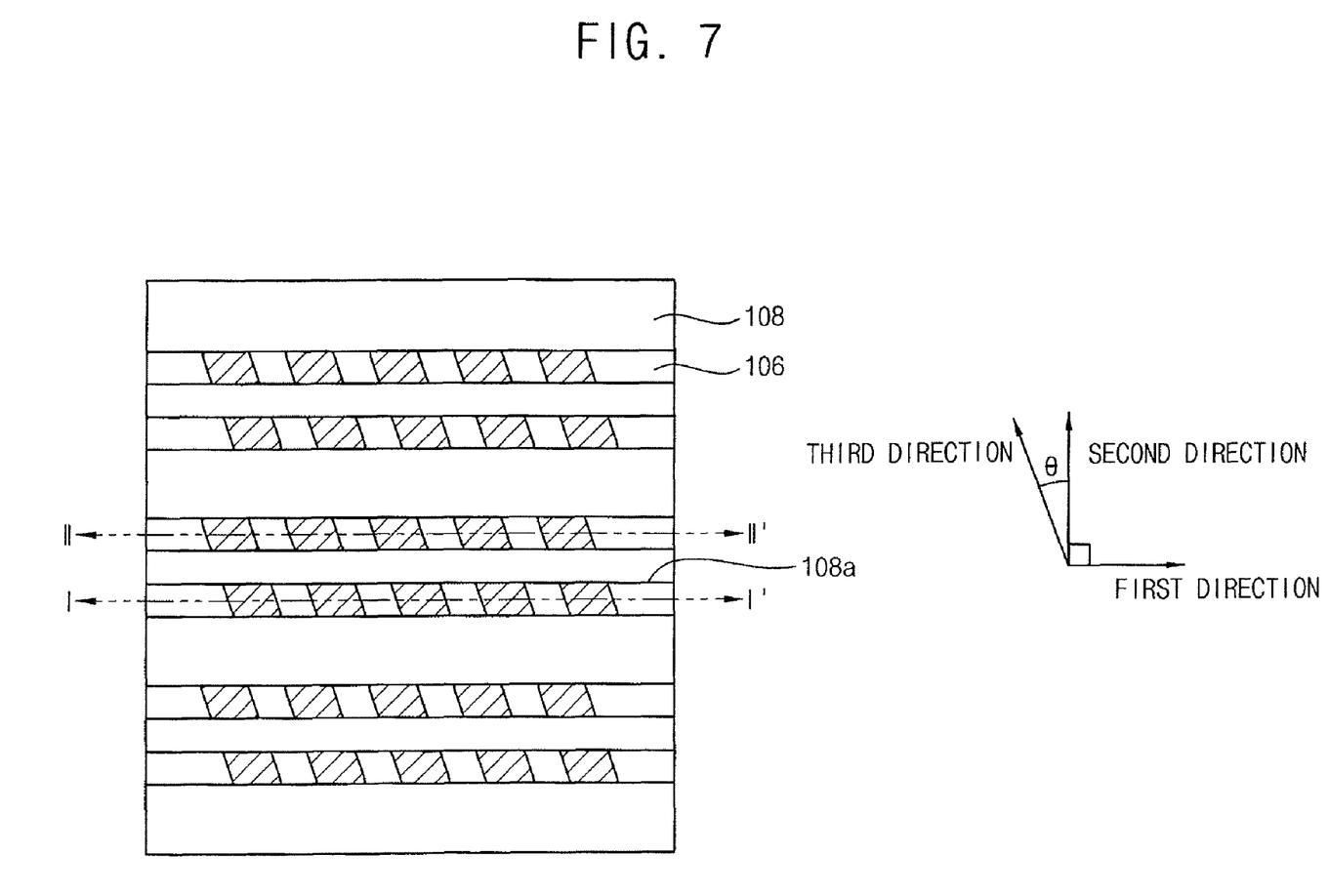
Figure 8:
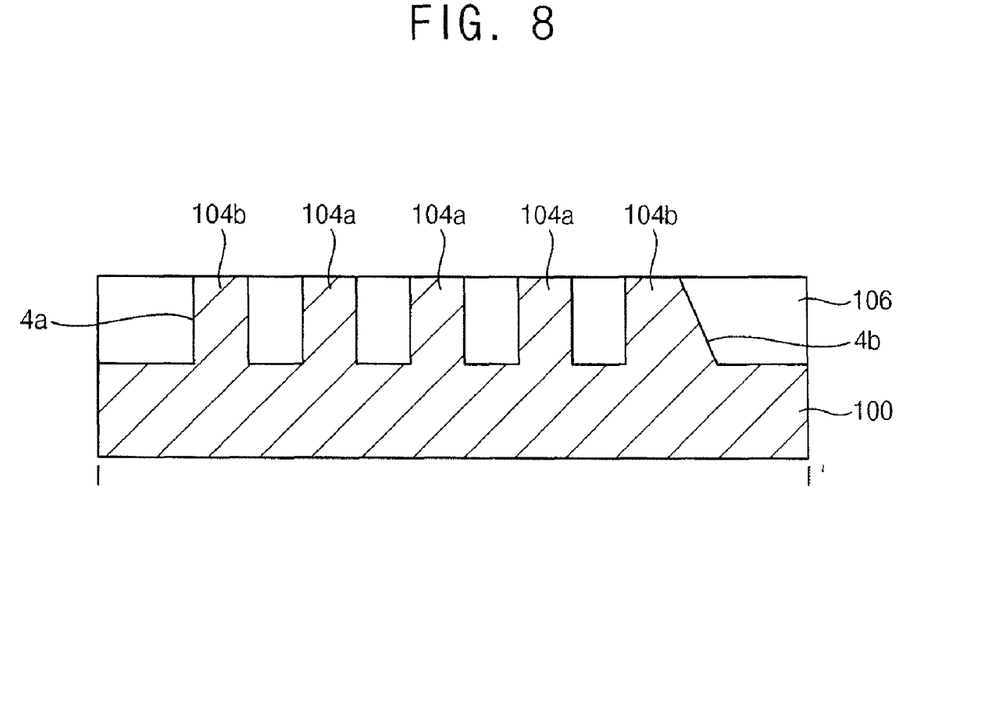
FIG. 8 is a cross-sectional view taken along a line I-I' in FIG. 7.
Figure 9:
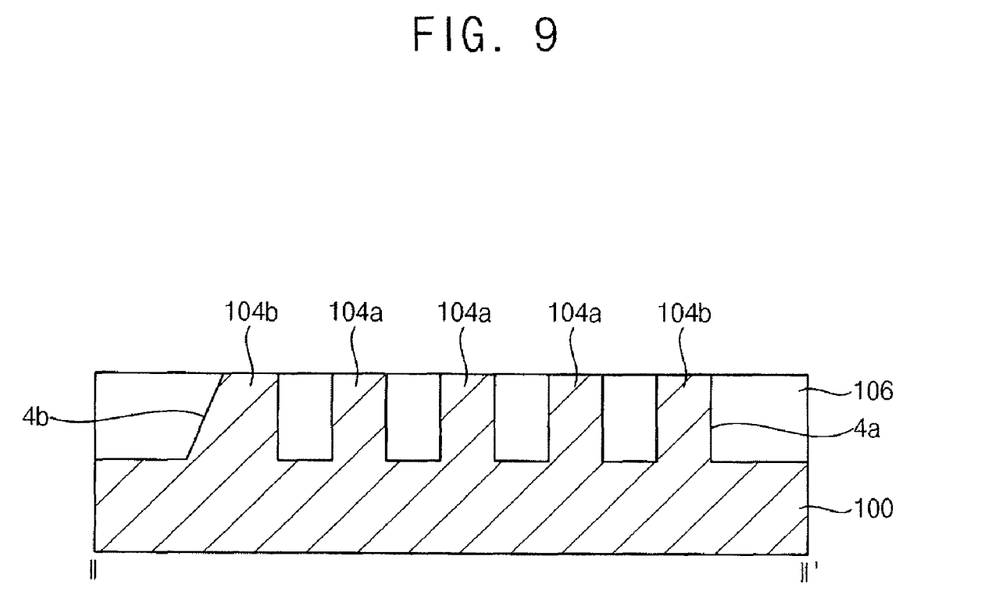
FIG. 9 is a cross-sectional view taken along a line II-II' in FIG. 7.
Figure 10:
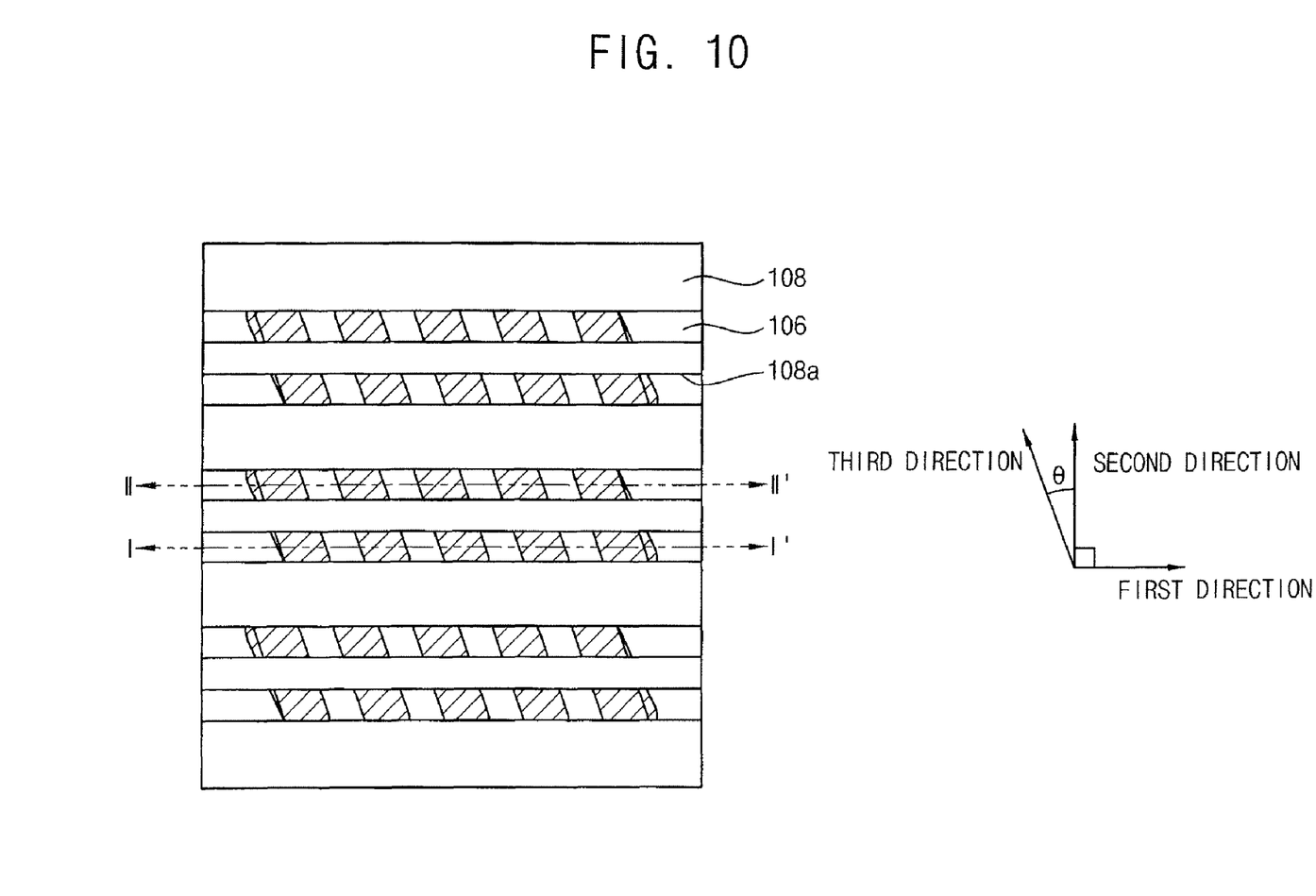
Figure 11:
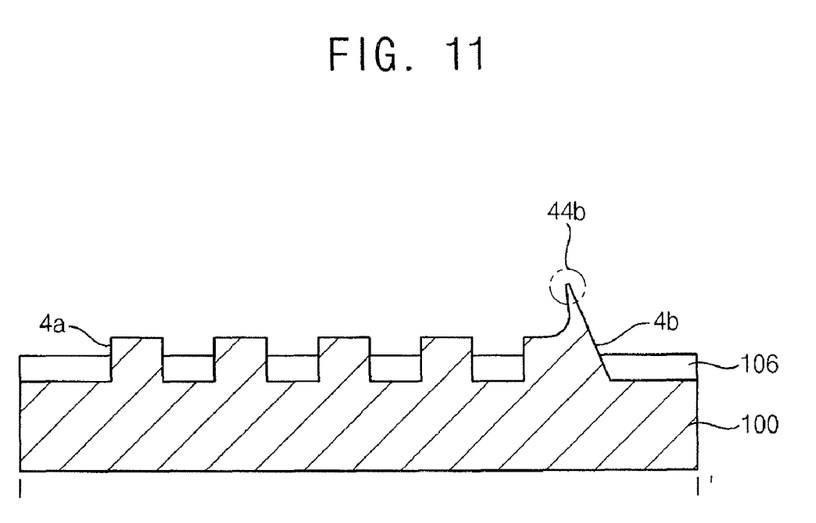
FIG. 11 is a cross-sectional view taken along a line I-I' in FIG. 10.
Figure 12:
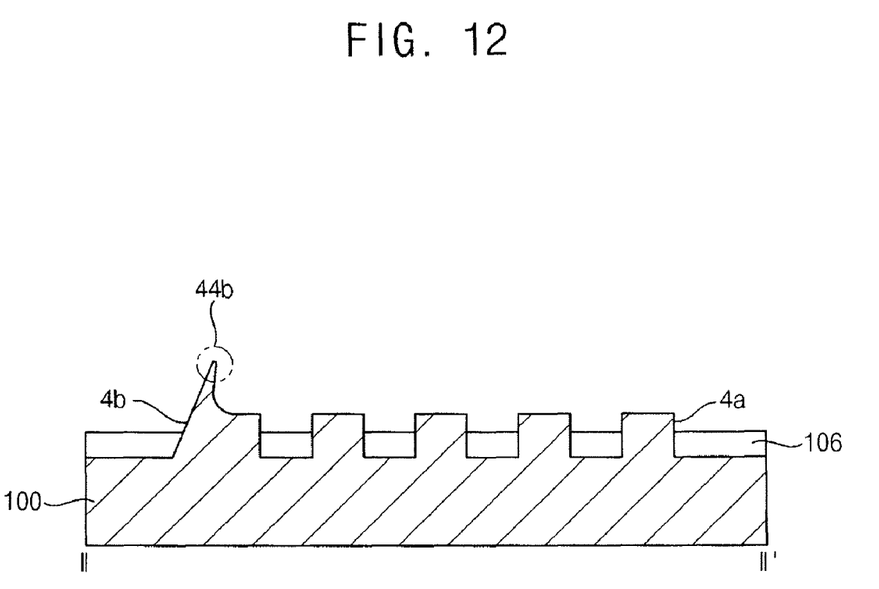
FIG. 12 is a cross-sectional view taken along a line II-II' in FIG. 10.
Figure 13:
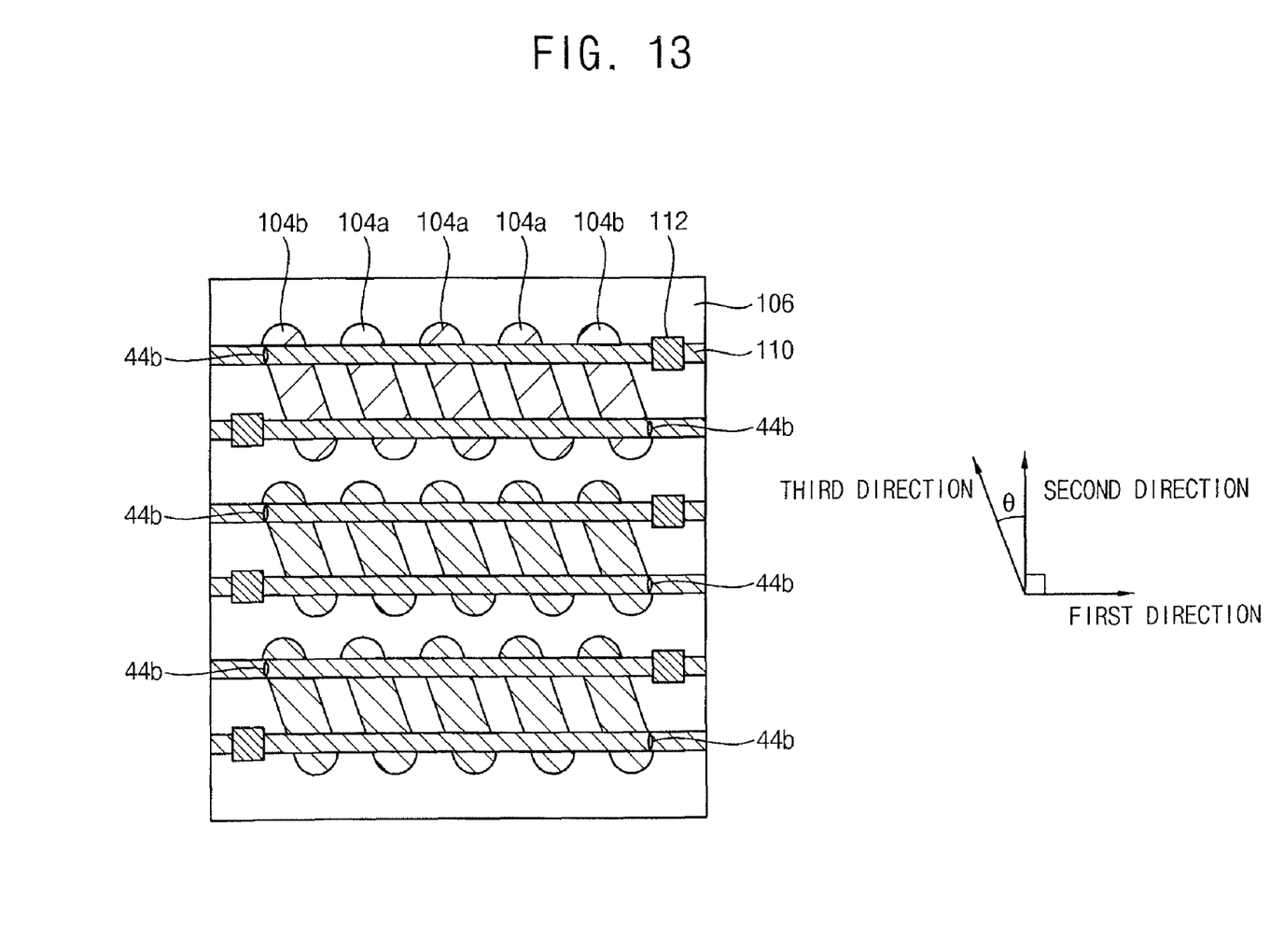
Figure 14:
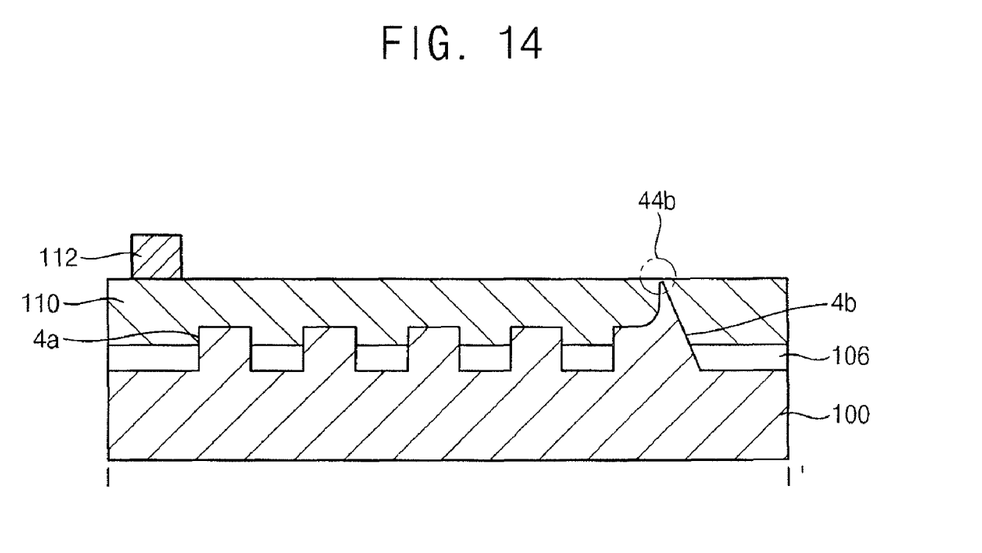
FIG. 14 is a cross-sectional view taken along a line I-I' in FIG. 13.
Figure 15:
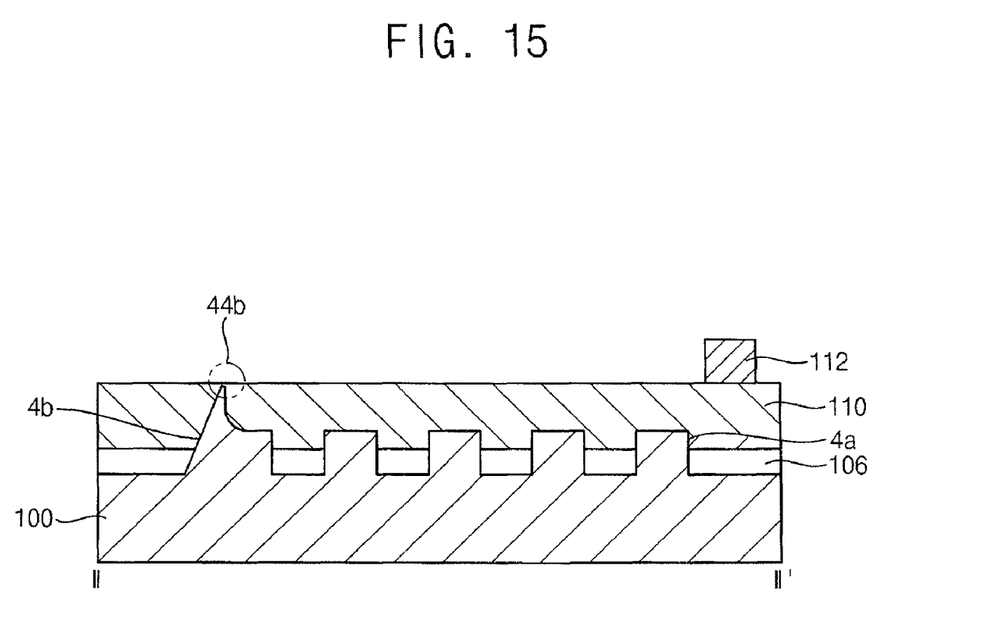
FIG. 15 is a cross-sectional view taken along a line II-II' in FIG. 13.

FIGS. 1, 2, 7, 10 and 13 are plan views illustrating a method of forming a wire structure in accordance with example embodiments of the present general inventive concept. FIG. 3 is a cross-sectional view taken along a line I-I' in FIG. 2, and FIG. 4 is a cross-sectional view taken along a line II-II' in FIG. 2. FIG. 8 is a cross-sectional view taken along a line I-I' in FIG. 7, and FIG. 9 is a cross-sectional view taken along a line II-II' in FIG. 7. FIG. 11 is a cross-sectional view taken along a line I-I' in FIG. 10, and FIG. 12 is a cross-sectional view taken along a line II-II' in FIG. 10. FIG. 14 is a cross-sectional view taken along a line I-I' in FIG. 13, and FIG. 15 is a cross-sectional view taken along a line II-II' in FIG. 13.

Referring to FIG. 1, a plurality of first masks 102 is formed on a semiconductor substrate 100, for example, a silicon substrate. The first masks 102 may be spaced apart from each other in a first direction on the semiconductor substrate 100 by a first distance. Additionally, the first masks 102 may be separated from each other on the semiconductor substrate 100 along a second direction substantially perpendicular to the first direction. The first masks 102 may be separated by a second distance along the second direction. In example embodiments, the first masks 102 may be arranged in a matrix configuration. Each of the first masks 102 may have a structure extending along a third direction slanted relative to the second direction by a predetermined angle θ. For example, this angle θ may be in a range of about 0° to about 90°.

Referring to FIG. 2, the semiconductor substrate 100 is partially etched using the first masks 102 as etching masks. Then, the first masks 102 are removed from the semiconductor substrate 100. Thus, a plurality of active regions 104 is provided on the semiconductor substrate 100. In example embodiments, each of the active regions 104 may include a first active region 104a and a second active region 104b. The first active region 104a may be positioned at a central portion of the semiconductor substrate 100 and the second active region 104b may be disposed at a peripheral portion of the semiconductor substrate 100.

Each of the second active regions 104b may have a first sidewall 14a adjacent to one of the first active regions 104a, and a second sidewall 14b on a side opposite to one of the first active regions 104a. The second sidewall 14b of the second active region 104b may be separated from one of the first active regions 104a by a predetermined distance because the second active region 104b may be disposed at the peripheral portion of the semiconductor substrate 100.

The second sidewall 14b of the second active region 104b may include a first portion 4a adjacent to another second active region 104b, and a second portion 4b separated from another second active region 104b since a third direction may be sloped relative to the second direction by the acute angle θ. For example, the first portion 4a of the second sidewall 14b may have a density substantially higher than that of the second portion 4b of the second sidewall 14b.

Referring to FIGS. 3 and 4, the second portion 4b may have a positive slope with respect to the substrate 100 because an angular loading effect may occur in an etching process for forming the second active regions 104b. However, the first portion 4a and a sidewall of the first active region 104a may be substantially perpendicular to the semiconductor substrate 100 because the angular loading effect may not be caused. This angular loading effect will be described in detail as follows.

Figure 5:
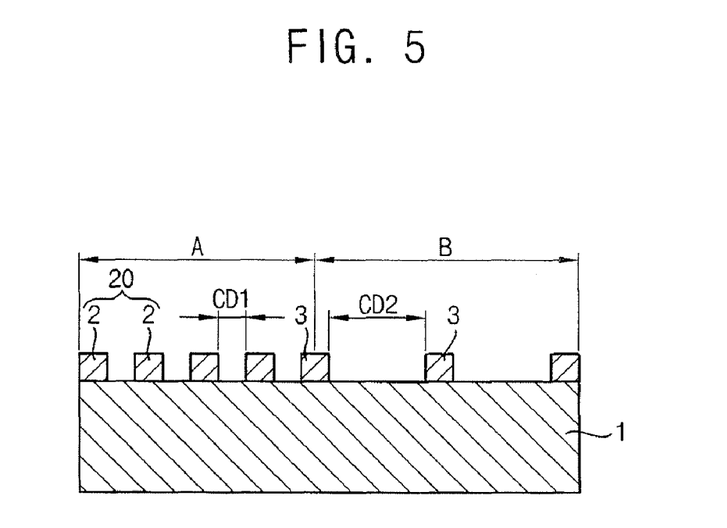
FIGS. 5 and 6 are cross-sectional views illustrating an angular loading effect.
Figure 6:
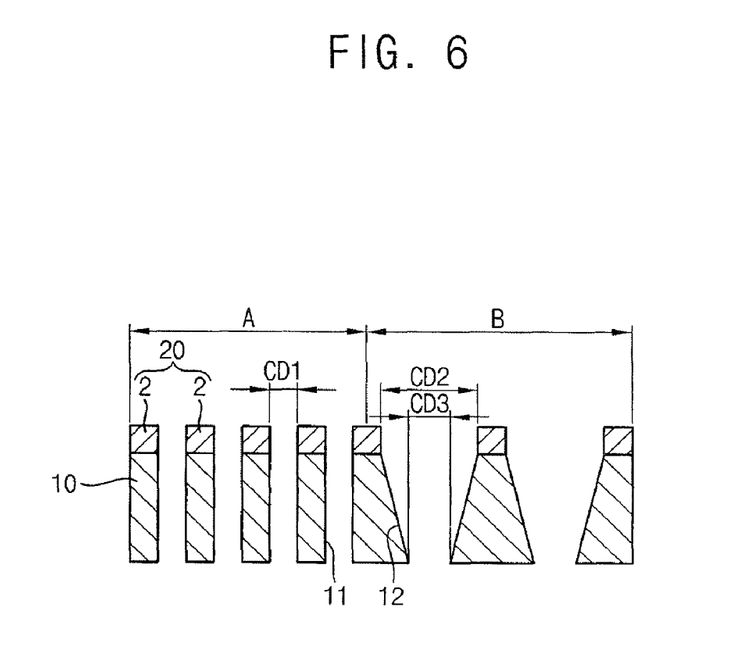

FIGS. 5 and 6 are cross-sectional views illustrating the angular loading effect.

Referring to FIG. 5, a mask structure 20 is formed on a layer 1 to be etched. The mask structure 20 may have a first region A including a plurality of first patterns 2 separated from each other, and a second region B including a plurality of second patterns 3 spaced apart from each other. The first region A may have a first pattern density, and the second region B may have a second density substantially larger than that of the first region A.

The first patterns 2 may be separated from each other by a first critical dimension CD1. The second patterns 3 may be spaced apart from each other by a second critical dimension CD2 substantially larger than the first critical dimension CD1.

Referring to FIG. 6, a pattern structure 10 is formed by etching the layer 1 to be etched using the mask structure 20 as an etching mask. The angular loading effect may not occur at a first portion of the layer 1 to be etched under the first region A of the mask structure 20. Accordingly, a first sidewall 11 positioned under the first region A may have a substantially vertical first profile. However, the angular loading effect may occur at a second portion of the layer 1 to be etched under the second region B of the mask structure 20. Hence, a second sidewall 12 disposed under the second region B may have a positive slope with respect to the layer 1. That is, a distance between adjacent second sidewalls 12 may be gradually decreased from upper portions of adjacent second sidewalls 12 toward lower portions of adjacent second sidewalls 12.

The upper portions of adjacent second sidewalls 12 may be separated from each other by the second critical dimension CD2, and the lower portions of adjacent second sidewalls 12 are separated from each other by a third critical dimension CD3. The third critical dimension CD3 may be substantially smaller than the second critical dimension CD2 because the second sidewall 12 has the positive slope relative to the layer 1 to be etched.

The angular loading effect may generally occur in a process of manufacturing a semiconductor device. A frequency and a degree of the angular loading effect may depend on a type of an etched pattern being used, an etching time, an etching temperature and an etching solution. The angular loading effect may mainly depend on an etching rate varying a pattern density of an etching mask structure.

When a distance between adjacent patterns of the etching mask structure is relatively large, the layer 1 to be etched may be excessively exposed to an etching solution, whereas etched residues may be removed effectively. Accordingly, an etching rate of the layer 1 may be increased and the angular loading effect may occur.

When a distance between adjacent patterns of the etching mask structure is relatively small, the layer 1 to be etched may be slightly exposed to an etching solution, whereas etched residues may not be properly removed. Thus, an etching rate of the layer 1 may be decreased and the angular loading effect may not be caused.

Referring now to FIG. 2, the angular loading effect may not occur at sidewalls of the first active regions 104a because all of the sidewalls of the first active regions 104a are close to adjacent first active region 104a or adjacent second active region 104b. That is, a pattern density near the sidewall of the first active region 104a is high, so that the angular loading effect does not occur at a sidewall of the first active region 104a.

When the semiconductor substrate 100 is partially etched to form the plurality of active regions 104, the angular loading effect does not occur at the first portion 4a of the second sidewall 14b of the second active region 104b because the first portion 4a is adjacent to another second active region 104b. That is, a pattern density near the first portion 4a is high to prevent a generation of the angular loading effect.

When the semiconductor substrate 100 is etched to form the plurality of active regions 104, the angular loading effect may occur at the second portion 4b of the second sidewall 14b of the second active region 104b since the second portion 4b of the second sidewall 14b is separated from adjacent first active region 104b and/or adjacent second active region 104b. Namely, a pattern density near the second portion 4b of the second sidewall 14b is low, such that a generation of the angular loading effect may occur.

Referring to FIGS. 7 to 9, an insulation layer is formed on the semiconductor substrate 100 to cover the active regions 104. The insulation layer may be formed using an insulation material such as silicon oxide. In example embodiments, a planarization process such as a chemical mechanical polishing (CMP) process and/or an etch back process may be performed about the insulation layer until the active regions 104 are exposed. Thus, an isolation layer 106 is provided on the substrate 100. The isolation layer 106 may have an upper face having a height substantially the same as that of an upper face of the active region 104. The sidewall of the active region 104 may be covered with the isolation layer 106.

A second mask 108 having at least one opening 108a extending along the first direction is formed on the active regions 104 and the isolation layer 106. In example embodiments, two openings 108a of the second mask 108 extending along the first direction may be corresponded to one active region 104.

In example embodiments, one of the openings 108a may extend from the second portion 4b of the second active region 104b toward the first portion 4a of the second active region 104b disposed opposite to the second portion 4b along the first direction. Another of the openings 108a may extend from the first portion 4a of the second active region 104b toward the second portion 4b of the second active region 104b disposed opposite to the first portion 4a along the first direction. When two openings 108a of the second mask 108 extend between second active regions 104b, two openings 108a of the second mask 108 may extend across the first active regions 104a disposed between the second active regions 104b.

Referring to FIGS. 10 to 12, a portion of the isolation layer 106 exposed by the opening 108a of the second mask 108, a portion of the first active region 104a exposed by the opening 108a, and a portion of the second active region 104b exposed by the opening 108a are etched using the second mask 108 as an etching mask. Thus, heights of the exposed portions of the isolation layer 108, the first active region 104a and the second active region 104b may be reduced. Accordingly, a groove extending along the first direction may be formed on the isolation layer 108, the first active region 104a and the second active region 104b. The upper face of the isolation layer 108 constituting a bottom face of the groove may have a height substantially lower than those of the first and the second active regions 104a and 104b.

Since the second portion 4b of the second active region 104b has the positive slope, the second portion 4b of the second active region 104b may be partially changed into a fence 44b after the etching process, so that the fence 44b may be provided at the second portion 4b of the second active region 104b. The fence 44b may have a height substantially higher than those of the first and the second active regions 104a and 104b.

In another example embodiment, after partially etching the isolation layer 106 using the second mask 108 as the etching mask, the first and the second active regions 104a and 104b may be etched to form the groove on the substrate 100.

In still another example embodiment, after etching the first and the second active regions 104a and 104b using the second mask 108 as the etching mask 108, the isolation layer 106 may be etched to form the groove on the substrate 100.

In still another example embodiment, the isolation layer 106 may be etched using the second mask 108 as the etching mask, and then the first and the second active regions 104a and 104b may be etched to form the groove. Then, the isolation layer 106 may be additionally etched using the second mask 108.

Referring to FIGS. 13 to 15, a conductive layer is formed on the substrate 100 to fill in the groove. The conductive layer may have a bar shape extending along the first direction. In an example embodiment, the conductive layer may be formed using a metal or a metal compound an electrical conductivity. For example, the conductive layer may include titanium nitride (TiNx).

The conductive layer is partially etched to reduce a height of the conductive layer. Accordingly, a wire 110 is formed on the isolation layer 106, the first active regions 104a and the second active regions 104b.

A contact 112 is formed on the wire 110. The contact 112 may be formed using a metal and/or a metal compound. As illustrated in FIGS. 14 and 15, the fence 44b is formed at the second portion 4b of the second active region 104b, so that the wire 110 may be cut by the fence 44b because the fence 44b has a height substantially higher than those of the first and the second active regions 104a and 104b.

In example embodiments, the contact 112 may be disposed toward the first active region 104a from the fence 44b. In this manner, although the wire 110 is cut by the fence 44b, voltages may be properly applied to the first and the second active regions 104a and 104b through the contact 112. However, when the contact 112 is disposed more toward the fence 44b and further away from the first active region 104a, voltages may not be properly applied to the first and the second active regions 104a and 104b through the contact 112 because the wire 110 is cut by the fence 44b. In other words, when the contact 112 is formed farthest away from the second active regions 104b containing a fence 44b, voltages can be applied to each of the first and second active regions 104a and 104b through the wire 110 without the wire 110 being cut by a fence 44b formed on the second active region 104b, thus providing a more stable electrical connection from the contact 112 through the wire 110 to each of the active regions 104a and 104b.

According to various example embodiments of the present general inventive concept, a location of a contact may be changed as a position of a fence formed in an active region. When the fence cutting a wire is generated beneath the wire, voltages may be properly applied to the active region through the contact. Therefore, a semiconductor device including the contact may have improved electrical characteristics and reliability.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of forming a wire structure, comprising:
    forming first active regions on a substrate, each of the first active region including a first sidewall having a positive slope and a second sidewall disposed opposite to the first sidewall;
    forming second active regions arranged on the substrate along a first direction;
    forming an isolation layer on the substrate between the first and the second active regions;
    forming a first mask on the first active regions, the second active regions and the isolation layer, the first mask having an opening exposing the first sidewall of the first active region and extending along the first direction;
    partially etching the first active regions, the second active regions and the isolation layer using the first mask to form a groove extending along the first direction and to form a fence from a portion of the first sidewall, the fence having a height substantially higher than a bottom surface of the groove;
    forming a wire filling the groove; and
    forming a contact on the wire, the contact being disposed toward the second active regions farthest from the fence.

2. The method of claim 1, wherein the positive slope of the first sidewall is caused by an angular loading effect.

3. The method of claim 1, wherein forming the first and the second active regions comprises:
    forming second masks on the substrate, the second masks being separated from each other along the first direction;
    partially etching the substrate using the second masks as etching masks; and
    removing the second masks from the substrate.

4. The method of claim 3, wherein a first portion of the second masks disposed on the first sidewall has a density substantially smaller than that of a second portion of the second masks disposed on the second sidewall.

5. The method of claim 3, wherein a sidewall of the first portion of the second masks is separated from a sidewall of an adjacent second mask, a sidewall of the second portion of the second masks is closed to a sidewall of the adjacent second mask.

6. The method of claim 1, wherein forming the wire comprises:
    forming a conductive layer to fill the groove; and
    partially removing the conductive layer to provide the wire having a height substantially lower than a depth of the groove.

7. The method of claim 1, wherein the wire has a height substantially lower than that of the fence so that the wire is cut by the fence.

8. The method of claim 7, wherein the wire is cut by the fence.

9. The method of claim 1, wherein the second sidewall and sidewalls of the second active regions are substantially perpendicular to the substrate.

10. The method of claim 1, wherein the first active regions and the second active regions are formed simultaneously.

11. A method of forming a wire structure, comprising:
    forming a plurality first active regions on a substrate, each of the first active regions including a first sidewall and a second sidewall disposed opposite to the first sidewall wherein the first sidewall includes a first portion having a positive slope and a second portion substantially perpendicular to the substrate;
    forming a plurality of second active regions arranged on the substrate along a first direction;
    forming an isolation layer on the substrate between the first active regions and the second active regions;
    forming a first mask on the first active regions, the second active regions and the isolation layer, the first mask having an opening exposing the first sidewall and extending along the first direction;
    partially etching the first active regions, the second active regions and the isolation layer using the first mask, to form grooves extending along the first direction and to form a fence from a portion of the first sidewall, the fence having a height substantially higher than bottom surfaces of the grooves;
    forming a wire to fill the grooves; and
    forming a contact on the wire, the contact being disposed toward the second active region farthest away from the fence.

12. The method of claim 11, wherein the positive slope of the first sidewall is generated by an angular loading effect.

13. The method of claim 11, wherein forming the first and the second active regions comprises:
    forming second masks on the substrate, adjacent second masks being separated from each other along the first direction;

etching the substrate using the second masks as etching masks; and removing the second masks from the substrate.

14. The method of claim 13, wherein a first portion of the second masks disposed on the first sidewall has a density substantially smaller than that of a second portion of the second masks disposed on the second sidewall.

15. The method of claim 13, wherein a sidewall of the first portion of the second masks is spaced apart from a sidewall of an adjacent second mask, a sidewall of the second portion of the second masks is closed to the sidewall of the adjacent second mask.

16. A method of forming a wire structure, comprising:

forming a plurality of active regions along a first direction on a substrate such that an active region at an end of the plurality of active regions includes a first sidewall having a positive slope and a second sidewall disposed opposite to the first sidewall and perpendicular to the substrate while the other active regions include opposing sidewalls perpendicular to the substrate;

forming an isolation layer across and between the active regions;

forming a mask on the active regions and the isolation layer, the first mask having an opening exposing the first sidewall of the end active region and extending along the first direction;

partially etching the active regions and the isolation layer using the first mask to form a groove extending along the first direction and to form a fence from a portion of the first sidewall, the fence having a height substantially higher than a bottom surface of the groove;

forming a wire within the groove; and forming a contact on the wire farthest from the fence.

17. The method of claim 16, wherein the first sidewall having the positive slope has a higher density than the other sidewalls such that an angular loading effect occurs when the active regions are etched.

\* \* \* \* \*